(12) United States Patent
Weiner et al.

(10) Patent No.: US 7,787,779 B2
(45) Date of Patent: Aug. 31, 2010

(54) PHOTONIC TIME-DOMAIN ELECTROMAGNETIC SIGNAL GENERATOR AND SYSTEM USING THE SAME

(75) Inventors: Andrew M. Weiner, West Lafayette, IN (US); Jason D. McKinney, Waldorf, MD (US)

(73) Assignee: Purdue Research Foundation, West Lafayette, IN (US)

( * ) Notice: Subject to any disclaimer, the term of this patent is extended or adjusted under 35 U.S.C. 154(b) by 1122 days.

(21) Appl. No.: 11/418,585

(22) Filed: May 4, 2006

(65) Prior Publication Data

US 2007/0019282 A1 Jan. 25, 2007

Related U.S. Application Data

(60) Provisional application No. 60/678,731, filed on May 6, 2005.

(51) Int. Cl.
*H04B 10/04* (2006.01)
(52) U.S. Cl. ...................................................... 398/201
(58) Field of Classification Search ................... 398/201
See application file for complete search history.

(56) References Cited

U.S. PATENT DOCUMENTS

| 6,671,298 | B1 | 12/2003 | Delfyett et al. |
| 6,724,783 | B2 | 4/2004 | Jalali et al. |
| 6,934,445 | B1 | 8/2005 | Leaird et al. |
| 7,126,740 | B2 * | 10/2006 | Szczepanek et al. ........ 359/290 |

OTHER PUBLICATIONS

Ahn et al., "Terahertz waveform synthesis via optical rectification of shaped ultrafast laser pulses," Optics Express, Oct. 6, 2003, vol. 11, No. 20, pp. 2486-2496.
Bayard et al., "Target Identification Using Optimization Techniques," IEEE Transactions on Antennas and Propagation, Apr. 1990, vol. 38, No. 4, pp. 450-456.
Bayard et al., "Optimization Method vs. E-Pulse Method in the Context of Target Discrimination," IEEE Transactions on Antennas and Propagation, Jan. 1991, vol. 39, No. 1, pp. 111-115.
Chou et al., "Adaptive RF-Photonic Arbitrary Waveform Generator," IEEE Photonics Technology Letters, Apr. 2003, vol. 15, No. 4, pp. 581-583.
Fok et al., "K-Pulse Estimation from the Impulse Response of a Target," IEEE Transactions on Antennas and Propagation, Aug. 1987, vol. AP-35, No. 8, pp. 926-933.
Han et al., "A New Ultra-Wideband, Ultra-Short Monocycle Pulse Generator with Reduced Ringing," IEEE Microwave and Wireless Components Letters, Jun. 2002, vol. 12, No. 6, pp. 206-208.

(Continued)

*Primary Examiner*—Leslie Pascal
(74) *Attorney, Agent, or Firm*—Brinks Hofer Gilson & Lione

(57) ABSTRACT

A photonic waveform generator and system is described. The photonic waveform generator is used in produce an electrical pulse having arbitrarily controllable temporal characteristics in a Fourier transform (FT) pulse shaper or a direct space-to-time (DST) photonic generator. The electrical pulse signal may be used in a radar, a telecommunications system or other electrical apparatus where the spectral and temporal characteristics of the signal are be optimized with respect to specific system needs, such as spectral occupancy, peak-to-average power, minimum pulse duration, target-to-clutter ratio, target type discrimination, and the like.

12 Claims, 9 Drawing Sheets

OTHER PUBLICATIONS

Jiang et al., "Spectral line-by-line pulse shaping," Optics Letters, Jun. 15, 2005, vol. 30, No. 12, pp. 1557-1559.

Kennaugh, E., "The K-Pulse Concept," IEEE Transactions on Antennas and Propagation, Mar. 1981, vol. AP-29, No. 2, pp. 327-331.

Lamensdorf et al., "Baseband Pulse Antenna Techniques," IEEE Antennas and Propagation Magazine, Feb. 1994, vol. 36, No. 1, pp. 20-30.

Leaird et al., "Generation of High Repetition Rate WDM Pulse Trains from an Arrayed-Waveguide Grating," IEEE Photonics Technology Letters, Mar. 2001, vol. 13, No. 3, pp. 221-223.

Leaird et al., "Femtosecond Direct Space-to-Time Pulse Shaping," IEEE Journal of Quantum Electronics, Apr. 2001, vol. 37, No. 4, pp. 494-504.

Leaird et al., "Generation of Flat-Topped 500-GHz Pulse Bursts Using Loss Engineered Arrayed Waveguide Gratings," IEEE Photonics Technology Letters, Jun. 2002, vol. 14, No. 6, pp. 816-818.

Leaird et al., "Femtosecond direct space-to-time pulse shaping in an integrated-optic configuration," Optics Letters, Jul. 1, 2004, vol. 29, No. 13, pp. 1551-1553.

Lin, et al., "Photonic Synthesis of Broadband Microwave Arbitrary Waveforms Applicable to Ultra-Wideband Communication," IEEE Microwave and Wireless Components Letters, Apr. 2005, vol. 15, No. 4, pp. 226-228.

Liu et al., "Terahertz Waveform Synthesis via Optical Pulse Shaping," IEEE Journal of Selected Topics in Quantum Electronics, Sep. 1996, vol. 2, No. 3, pp. 709-719.

Liu et al., "Enhancement of narrow-band terahertz radiation from photoconducting antennas by optical pulse shaping," Optics Letters, Nov. 1, 1996, vol. 21, No. 21, pp. 1762-1764.

McKinney et al., "Millimeter-wave arbitrary waveform generation with a direct space-to-time pulse shaper," Optics Letters, Aug. 1, 2002, vol. 27, No. 15, pp. 1345-1347.

McKinney et al., "Photonically assisted generation of continuous arbitrary millimeter electromagnetic waveforms," Electronics Letters, Feb. 6, 2003, vol. 39, No. 3, pp. 309-311.

McKinney et al., "Photonically Assisted Generation of Arbitrary Millimeter-Wave and Microwave Electromagnetic Waveforms via Direct Space-to-Time Optical Pulse Shaping," Journal of Lightwave Technology, vol. 21, No. 12, Dec. 2003, pp. 3020-3028.

McKinney et al., "Direct Space-to-Time Pulse Shaping at 1.5 μm," IEEE Journal of Quantum Electronics, Dec. 2003, vol. 39, No. 12, pp. 1635-1644.

Mittleman et al., "T-Ray Imaging," IEEE Journal of Selected Topics of Quantum Electronics, Sep. 1996, vol. 2, No. 3, pp. 679-692.

Park et al., "High-Power Narrow-Band Terahertz Generation Using Large-Aperture Photoconductors," IEEE Journal of Quantum Electronics, Aug. 1999, vol. 35, No. 8, pp. 1257-1268.

Poinsot, "Continuous radio-frequency tuning of an optoelectronic oscillator with dispersive feedback," Optics Letters, Aug. 1, 2002, vol. 27, No. 15, pp. 1300-1302.

Pozar, "Waveform Optimizations for Ultrawideband Radio Systems," IEEE Transactions on Antennas and Propagation, Sep. 2003, vol. 51, No. 9, pp. 2335-2345.

Rothwell et al., "Radar Target Discrimination using the Extinction-Pulse Technique," IEEE Transactions on Antennas and Propagation, Sep. 1985, vol. AP-33, No. 9, pp. 929-937.

Shlivinski et al., "Antenna Characterization in the Time Domain," IEEE Transactions on Antennas and Propagation, Jul. 1997, vol. 45, No. 7, pp. 1140-1149.

Thurston et al., "Analysis of Picosecond Pulse Shape Synthesis by Spectral Masking in a Grating Pulse Compressor," IEEE Journal of Quantum Electronics, May 1986, vol. QE-22, No. 5, pp. 682-696.

Weiner, "Femtosecond pulse shaping using spatial light modulators," Review of Scientific Instruments, vol. 71, No. 5, May 2000, pp. 1929-1960.

Win, "Ultra-Wide Bandwidth Time-Hopping Spread-Spectrum Impulse Radio for Wireless Multiple-Access Communications," IEEE Transaction on Communications, vol. 48, No. 4, Apr. 2000, pp. 679-691.

Xiao et al., "Photonic Microwave Arbitrary Waveform Generation Using a Virtually Imaged Phased-Array (VIPA) Direct Space-to-Time Pulse Shaper," IEEE Photonics Technology Letters, vol. 16, No. 8, Aug. 2004, pp. 1936-1938.

Yilmaz et al., "Toward a Photonic Arbitrary Waveform Generator Using a Modelocked External Cavity Semiconductor Laser," IEEE Photonics Technology Letters, vol. 14, No. 11, Nov. 2002, pp. 1608-1610.

Federal Communications Commission, In the matter of: Revision of Part 15 of the Commission's Rules Regarding Ultra-Wideband Transmission Systems, "First Report and Order," Released: Apr. 22, 2002, pp. 1-118.

Lin, I.S., et al., "Microwave arbitrary waveform generation via open-loop, reflective geometry Fourier transform pulse shaper," Conference on Lasers and Electro-Optics (CLEO), May 16, 2004, San Francisco, CA, © 2004 OSA/CLEO 2004, © 2003 Optical Society of America, 4 pages.

2004 IEEE International Topical Meeting on Microwave Photonics, MWP 2004, Oct. 4-6, 2004, The Cliff House Resort & Spa, Ogunquit, Maine, www.mwp2004.org, 17 pages.

* cited by examiner

PHOTONIC TIME-DOMAIN ELECTROMAGNETIC SIGNAL GENERATOR AND SYSTEM USING THE SAME

CROSS-REFERENCE TO RELATED APPLICATIONS

This application claims the benefit of priority to U.S. provisional application Ser. No. 60/678,731, filed on May 6, 2005, which is incorporated herein by reference.

FEDERALLY SPONSORED RESEARCH OR DEVELOPMENT

This application is based on research sponsored by the U.S. Army Research Office under Grant No. DAAD19-03-1-0275.

TECHNICAL FIELD

This application relates to the generation and use of electromagnetic signals having arbitrary waveform characteristics.

BACKGROUND

The generation of radio-frequency (RF) electromagnetic signals using optical-to-electronic conversion has been used to overcome limitations in electronic-based waveform generation techniques when high center frequencies and large percentage bandwidths are required. At present, these limitations become important for bandwidths greater than about 1 GHz. For applications in radar and communications systems, waveforms designed with specific radio frequency characteristics would be useful, for example, in conforming to regulatory requirements on spectral occupancy, optimally detecting specific radar targets, and compensating for the frequency-dependent characteristics of antenna systems, electronic components and the propagation media.

SUMMARY

An electromagnetic system is described, including a photonic waveform generator communicating with a transmitting antenna. The system may further include a receiving antenna and a receiver. When photonic waveform generators such as Fourier-transform (FT) optical pulse shapers or direct space to-time (DST) optical pulse shapers are used, arbitrary time dependent waveforms may be generated and transmitted, and such waveforms may be used to optimize the design of a system.

Optimizations depend on the type of system, such as radar, telecommunications, measurement and the like, and may include a transmitted signal conforming to criteria for spectral occupancy, signals such that a received or transmitted signal has a minimum received pulse width, maximum signal-to-clutter ratio, minimum peak-to-average power ratio, or minimum sidelobe levels, signals matched to a detection filter, or signals with a controlled spectral phase, as examples.

In another aspect, a method of producing an arbitrarily shaped electrical pulse is described, including the steps of spectrally modifying an optical signal by using spatial modulator; time-dispersing the optical signal; and applying the dispersed optical signal to an optical-to-electrical converter. The spectral modulator may be, for example, a transmission or reflective-type Fourier-transform pulse shaper or a direct space-to-time pulse shaper.

In yet another aspect, a method of generating an electrical pulse with controlled spectral characteristics includes the steps of: specifying a desired electrical spectral power density profile; transforming the electrical spectral power density profile by Fourier transform to obtain an optical spectrum; spatially dispersing a short optical pulse; amplitude modulating the spatially dispersed optical pulse using a function proportional to the optical spectrum to form a spatially-amplitude-modulated optical spectrum; recombining the spatially-dispersed amplitude-modulated spectrum to form a modulated optical spectrum, time dispersing modulated optical spectrum; and, converting the time-dispersed modulated optical spectrum to an electrical signal.

In a further aspect, a method of generating an electrical pulse with controlled spectral characteristics includes the steps of: establishing a desired electrical spectral profile; transforming the electrical spectral profile by Fourier transform to obtain an equivalent optical spectral intensity profile; spatially dispersing the optical spectrum of the short optical pulse; spatially modulating the spatially dispersed optical spectrum using a function proportional to the equivalent optical spectral power density profile to form an amplitude-modulated optical spectrum; time dispersing the amplitude-modulated optical spectrum; and, converting the time-dispersed amplitude modulated optical spectrum to an output electrical signal.

In still a further aspect, a method of generating an electrical pulse with controlled spectral characteristics includes the steps of: specifying a desired time-dependent electrical signal waveform; spatially dispersing the spectrum of a short optical pulse; spatially amplitude modulating the spatially dispersed optical pulse using a function proportional to the desired time-dependent electrical signal waveform to form an amplitude modulated optical spectrum; time dispersing the amplitude-modulated optical spectrum; and, converting the time dispersed amplitude-modulated optical spectrum to an output electrical signal.

In still another aspect, a method of translating the center frequency of an electrical signal includes the steps of: determining a first optical spectrum amplitude corresponding to an electrical signal having a first electrical center frequency; computing a second optical spectral amplitude function equivalent to a second electrical center frequency used for electrical frequency translation; raising the second optical spectral amplitude function on a pedestal; multiplying the first optical spectral amplitude function by the second optical spectral amplitude function to form a third optical spectral amplitude function; and, generating a frequency-translated electrical signal by applying the third spectral amplitude function to a photonic waveform generator. The third optical spectral amplitude function may be multiplied by an apodizing function prior to applying the third optical spectral waveform to the waveform generator.

A photonic waveform generator is described, including a wavelength-dependent optical spectral amplitude shaper where the optical spectral amplitude shaper has a reflective-type spatial modulator; a wavelength-dependent time-delay network; and, an optical-to-electrical converter. The wavelength-dependent optical spectral amplitude shaper may also include a spatial modulator; a dispersive optical grating, a lens; and a reflective surface.

DETAILED DESCRIPTION

Figure 1:
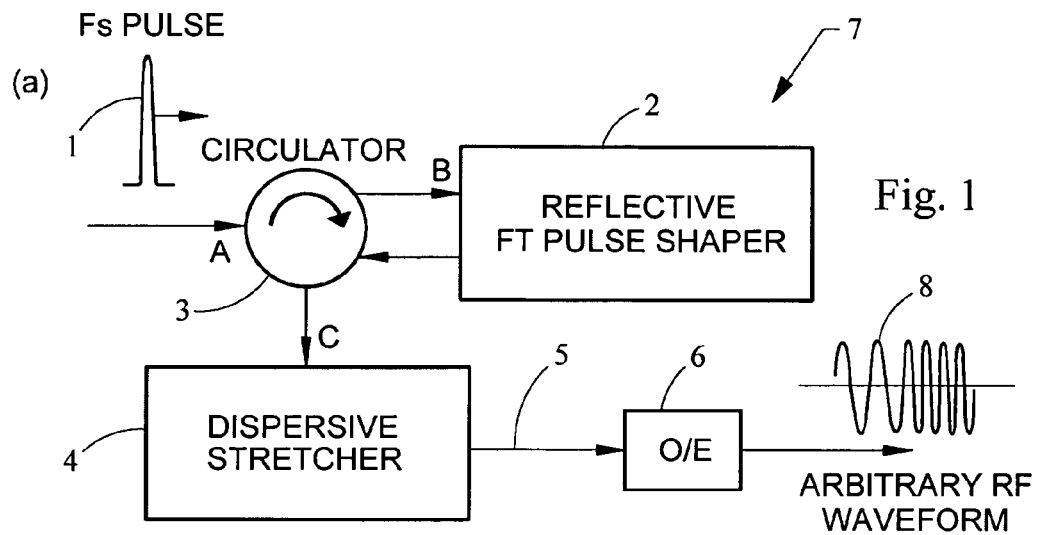
FIG. 1 is a block diagram of an embodiment showing the photonic waveform generator.

Exemplary embodiments may be better understood with reference to the drawings, but these examples are not intended to be of a limiting nature. Like numbered elements in the same or different drawings perform equivalent functions.

In the following description, numerous specific details are set forth in order to provide a thorough understanding of the present invention as set forth in the claims, which, however, may be practiced without some or all of these specific details. In other instances, well known process operations have not been described in detail in order not to unnecessarily obscure the description.

A photonic waveform generator and method of generating electronic waveforms is described which permits the synthesis of a desired electrical waveform having arbitrary temporal characteristics. The use of such waveforms in various systems is described. The characteristics of the electrical waveform to be generated may conform to specific bandwidths, center frequencies and spectral shapes which are suitable for the intended use. In some generated waveforms, the spectral phase may also be controlled.

Electrical waveforms having specifiable characteristics, such as spectral shape, spectral phase and time duration are applicable to, for example, radar, telecommunications, and sensing systems. Broadband electromagnetic systems may be designed to conform to governmental regulations for transmitted power, power spectral density, duration, bandwidth or the like; to use waveforms whose characteristics optimize a detected or demodulated signal-to-noise ratio with respect to design constraints. Such waveforms can be generated when the waveform generator is capable of producing effectively arbitrary waveforms, which, for example, can include waveforms which may have properties of maximizing a average power for a peak-power-limited generator or transmitter while meeting specific bandwidth requirements. Where the term "arbitrary" is used in describing a signal or waveform, it will be understood by a person of skill in the art that what is meant is the ability to control the signal or waveform parameters with respect to amplitude, phase, frequency and time essentially independently, within the constraints of physical realizability.

Fourier transform or other known methods of characterizing and specifying the temporal or spectral waveforms described herein are described generally as time-to-frequency or frequency-to-time transformations as are used in methods of signal analysis, filter design, and the like, which are known to persons of skill in the art. Therefore, the details of performing the mathematical operations required are usually not presented herein. Equally, the mathematical equivalence of frequency and temporal representations of a signal and the use of convolution or multiplication of functions are well known and may be interchangeable in the spectral and time domains. These design tools may be used in the apparatus, methods and systems described herein to produce an electrical waveform meeting specific design criteria.

In broadband electrical systems, a transmitted signal may suffer distortion arising from the phase and amplitude transmission characteristics of such system components as the amplifiers and antennas and the transmission medium. A transmitted waveform may be pre-distorted by the photonic waveform generator so that, for example, the peak received signal may be optimized for a specific transmitted energy after being modified by the system components. An arbitrary waveform generator, which may be a photonic waveform generator, may generate electrical waveforms whose frequency content is time varying, and such waveforms may further optimize system performance when a peak power limitation is encountered.

The photonic waveform generator may be comprised of a broadband optical source having pulse characteristics, an optical spectrum shaper, an optical frequency-to-time converter, such as a dispersive pulse stretcher, and an optical-to-electrical converter, such as a photodetector. Alternatively, the pulsed optical source may be external to the photonic waveform generator. In an aspect, the signal spectral design may be performed by specifying the desired signal spectrum. This may include, for example, the bandwidth and spectral shape, center frequency and spectral phase. The spectral characteristics desired may be transformed into the temporal domain by an inverse Fourier transform in order to obtain a temporal waveform resulting in the desired spectral characteristics. Accordingly, the optical spectrum pulse shaper and the optical frequency-to-time converter may be configured such that the output power of the optical frequency-to-time converter represents the desired electrical waveform. The combination of an optical spectrum shaper and the optical frequency to-time converter may be termed a photonic waveform generator or photonic signal generator. Photonic signal generators may include transmission- and reflection-type Fourier transform (FT) pulse shapers, and direct space-to-time (DST) optical pulse shapers.

An optical frequency-to-time converter may not be necessary, particularly when the desired waveform time duration is consistent with that which may be produced by the optical pulse shaper.

In an aspect, the optical signal output from the photonic signal generator is caused to impinge on an optical-to electronic converter, the output therefrom being an electrical signal having the temporal waveform characteristics of the optical signal input thereto. This output electrical signal may be transmitted by radiation from an antenna, in a waveguide, or used in another electronic system. The electrical signal may be amplified or filtered by conventional means prior to use.

The temporal properties of the waveform also may be specified directly. In an aspect, the FT spectral shaper may be used to modify the spectral amplitude of the optical pulse such that it exhibits an appropriate optical spectral shape, corresponding to the envelope of the temporal electrical signal desired, and the optical frequency-to-time converter disperses the optical energy with respect to a time base, such that the amplitude characteristics of the optical signal correspond to the temporal properties of the electrical waveform desired.

Mapping of a time-dispersed optical spectrum to an electrical waveform permits realization of a variety of waveforms suitable, for example, for communications and radar applications. As examples: a generated signal may be pre-distorted in order to compensate for antenna or propagation path distortions; a radar signal may be optimized for maximum signal return from a specific type or shape of target; phase shift keying data may be included within a short pulse transmission; and, the transmission spectrum may be shaped to meet regulatory requirements for the characteristics of ultra-wideband (UWB) radiation, or to improve the detected signal-to-noise ratio.

In an aspect, the parameters required to generate a signal having characteristics matched to a physical target (for example, a distorting system or a radar target) may be obtained by determining the impulse response of the target or system, either analytically or experimentally, depending on the relative convenience of each method for a particular application. The signal being generated may be pre-distorted such that the resultant system or target characteristics are accommodated so as to achieve a desired received signal property when a received signal is applied to the detection filter.

Experimentally, by exciting the system or target with an impulse function waveform in the time domain and measuring the system output or target return properties, the system or target frequency transfer function response in both magnitude and phase can be determined. A signal waveform or process may then be designed so as to optimize, for example, the output signal-to-noise ratio of the specific system, or of a radar target return. Alternatively, if the target physical properties are known a priori, the impulse or frequency response can be calculated using numerical electromagnetic techniques. The waveform may also be designed to minimize temporal sidelobes, either as transmitted or as received, or to maximize the relative return of one target type with respect to another target type. Such waveform design techniques are known in the art; however the ability to generate waveforms having the desired temporal or spectral or joint temporal and spectral properties may be difficult using conventional electrical techniques.

A method of waveform design includes: specifying the desired electrical frequency spectral waveform; transforming the desired electrical frequency spectral waveform into a time-domain representation; raising the waveform on a pedestal such that the value of the waveform is non-negative during the duration of the pulse; generating an optical spectrum having a shape corresponding to the shape of the raised time-domain waveform, dispersing the optical spectrum so as to map each optical frequency to a relative time delay; and, detecting the time-dispersed optical spectrum to convert the optical energy to a electrical waveform. Where the term radio frequency is used, it is intended to cover the entire frequency spectrum extending downward from frequencies transmitted and received by optical means, such as the microwave, millimeter and higher bands, as examples. The use of the term "radio frequency" is meant to be descriptive of a signal frequency range extending from essentially direct current (DC) to frequencies where optical signal generating means are used. Consequently, the term "radio frequency" should not be interpreted to require that the signal or energy be radiated as electromagnetic waves. The generated electrical signals may be used in equipment without being radiated, or may be radiated, depending on the application.

A desired temporal electrical waveform may be generated as shown in FIG. 1. A short optical pulse 1 is introduced into the photonic waveform generator 7 through port A of the circulator 3. The pulse may be optical energy from any of a variety of optical sources, and the pulse may be amplified by an erbium-doped fiber amplifier (EDFA), semiconductor optical amplifier (SOA), or the like. The optical signal may have a typical bandwidth of about 35 nm and a time duration of about 100 fs. The short optical pulses are output through port B of the circulator 3 and introduced into a reflective-type Fourier transform (FT) pulse shaper 2. The optical amplitude spectrum of the pulse 1 is modified in accordance with the desired resultant electrical waveform by the FT pulse shaper 2 and is output from the FT pulse shaper 2 to the circulator 3. The modified optical spectrum passes through the circulator 3 and output through port C into the dispersive pulse stretcher 4. The dispersive pulse stretcher 4 may be an optical fiber (not shown) having chromatic dispersion such that energy at that differing optical frequencies simultaneously input at a proximal end of the fiber are output from a distal end of the fiber with a time difference therebetween, having a time-difference dependence which is related to the optical frequency difference therebetween. Other dispersive media and techniques may be used for optical pulse stretching, providing that the transmission bandwidth is greater than that of the optical signal spectrum width. These include gratings, prisms, virtually imaged phased arrays (VIPAs), or pairs thereof, and the like. Using pairs of gratings, and the like, may also be a means of optical frequency-to time conversion.

Figure 2:
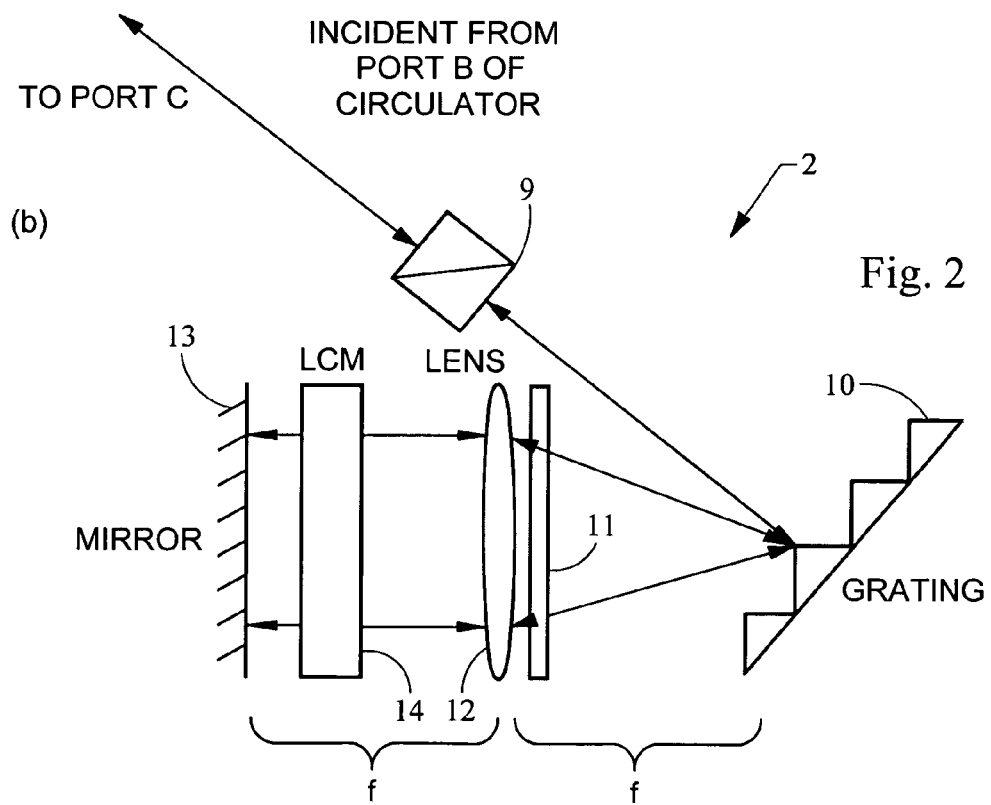
FIG. 2 is a representation of the arrangement of the components of pulse shaper of FIG. 1.

The temporal characteristics of the optical power in the time-dispersed optical spectrum at the output 5 of the dispersive stretcher 4 represent an optical equivalent of the electrical waveform desired. The combination of a reflective FT pulse shaper and a dispersive stretcher may be considered as an example of a photonic waveform generator 7. However, the photonic waveform generator may also include other related components such as the optical to electronic (O/E) conversion means. While components such as the dispersive stretcher 4 and the reflective FT pulse shaper 2 are shown as separate modules, this is done for clarity of explanation. One skilled in the art will appreciate that each of the components in FIG. 1, and subcomponents such as shown in FIG. 2 may be arranged in a variety of physical configurations to produce the same resulting signal. Where a pulse shaper and a dispersive stretcher are used, the positions of the pulse shaper and the dispersive stretcher may be interchanged with respect to the photodetector.

The optical signal output from the pulse shaper and dispersive network may be caused to impinge on an optical-to-electrical (O/E) converter 6 such that the optical signal is converted into an electrical voltage 8. The O/E converter 6 may be a photodetector, photomultiplier, photoconductive antenna, or the like. The reflective FT pulse shaper 2 shown in FIG. 2 is used to impose a spatial spectral-amplitude modulation onto each optical pulse. A reflective-type FT pulse shaper has an advantage of minimizing the number of components with respect to a transmission-type pulse shaper, and by being substantially self-aligning.

As is known in the field of optics, the spectral characteristics of an optical signal may be described as a function of optical frequency or a function of optical wavelength, one being proportional to the inverse of the other. Herein either means of description may be used. Modification of the optical input spectrum by the FT pulse shaper 2, results in spatial amplitude modulation in the optical wavelength (frequency) domain, but may not be a temporal modulation. That is, the frequency dependence of optical power at each optical frequency may be modified, but the optical frequency spectrum may be substantially non-time-varying within an optical pulse. The relative optical power at each specific optical frequency is modified. Modification of the optical input spectrum by the FT pulse shaper 2, results in spatial (spectral) amplitude modulation in the optical wavelength (frequency) domain. Typically the various optical wavelengths (frequencies) are recombined at the output of the FT pulse shaper 2 to yield an output signal that is spectrally modulated but no longer substantially spatially modulated.

Alternatively, modification of the optical input spectrum by the FT pulse shaper 2, may result in spatial phase modulation or both spatial phase and amplitude modulation in the optical wavelength (frequency) domain. When the various optical wavelengths (frequencies) are recombined at the output of the FT pulse shaper 2, this gives rise to an output optical waveform whose shape depends on the Fourier transform of the spatial phase and/or amplitude pattern transferred onto the spectrum.

As shown in the example of FIG. 2, the FT pulse shaper 2 may include a polarization beamsplitter 9, a diffraction grating 10, a half-wave plate 11, a lens 12 having a focal length f, a reflecting surface, which may be a mirror 13, and a liquid crystal display modulator (LCM) 14. The LCM 14 is disposed between the lens 12 and the mirror 13. The combination of the mirror 13, the LCM 14 the half-wave plate 11, and the polarization beamsplitter 9 performs a function equivalent to a reflective-type liquid crystal display (LCD), by spatially modulating an incident light source. The diffraction grating 10 spatially disperses the input optical waveform such that it mapped into a spatial distribution of optical energy impinging on the liquid crystal display modulator (LCM) 14, and each optical frequency corresponds to a physical location on the surface of the LCM 14.

The amplitude of the optical energy transmitted through the LCM 14 may be modified by altering the spatial transmission properties of the LCM 14 such that the transmission characteristics at each spatial location corresponds to the desired modification of the corresponding optical spectral amplitude, taking account of the passage of the optical energy back through the LCM 14 and half wave plate 11 after reflection by the mirror 13. The optical spectral resolution of the FT pulse shaper 2 is limited by the granularity of the LCM 14 and the spot size of the beam of optical energy. The optical spectral modulation may be static during the duration of a single optical pulse, but may be varied from pulse-to-pulse, limited only by the temporal response of the LCM 14.

The spectrally modified optical pulse passes through the lens 12 and is diffracted by the diffraction grating 10 such that the light energy is directed back through the polarization beamsplitter 9 and thus exits the FT pulse shaper 2 in a path direction opposite from, but substantially collinear with, the input path. The optical energy may be input to the pulse shaper using an optical fiber, bulk optics or the like. Typically, the spatially modulated optical spectrum energy is reintroduced into the fiber or other input means before being directed into the dispersive optical stretcher. In this state, at the output of the FT pulse shaper 2, the optical energy dependence on wavelength has been modified such that it represents the amplitude of the desired electrical waveform. However, the optical energy has a temporal aspect which is related to the input temporal properties of the optical waveform; that is, a very short pulse, and this characteristic may be altered in a dispersive pulse stretcher, if needed.

When the spatially-modulated spatially dispersed optical spectrum of the input optical pulse is output from the pulse shaper, the optical energy may have been reintroduced into an optical waveguide such as a fiber, and no longer be spatially dispersed, and so it is equally possible to term the optical energy at this point in the apparatus as being a modulated optical spectrum, as the spatially dispersed aspect is only an intermediate aspect of the transformation. Similarly, the spatially-dispersed optical spectrum is amplitude modulated by a waveform to form the modulated spectrum, but the amplitude modulation in the pulse shaper is in the spatially dispersed optical spectral domain rather than the electrical amplitude domain. In the example of FIG. 2, the LCM is the means of amplitude modulation of the spatially dispersed optical spectrum and the diffraction grating and lens are the means of spatial dispersion of the optical spectrum The spectrally modified (modulated) optical pulse output to the circulator 3 by the FT pulse shaper 2 may be directed into a dispersive optical pulse stretcher 4 through port C of the circulator 3. The dispersive optical pulse stretcher 4 may be a fiber exhibiting chromatic dispersion, but bulk optic equivalents may be also used. That is, the time delay associated with traversal of a fixed length of optical fiber, or the bulk optical equivalent thereof, is a function of optical wavelength. Fibers with positive dispersion, negative dispersion and, locally, no dispersion are known. The dispersion characteristics of the fiber or other dispersive medium used in the dispersive pulse stretcher 4 are those characteristics exhibited within the bandwidth of the optical energy of the optical pulse. A person of ordinary skill in the art will appreciate that the dispersion characteristics of a medium may change with wavelength and other physical factors such as temperature or pressure; thus, a different dispersion characteristic may be obtained at frequencies not within the optical wavelength regime of the pulse.

The sense of dispersion, the dispersion per unit length of the fiber, and the length of fiber are selected such that the optical signal may be transmitted through the fiber and exits the fiber with a relative time delay which depends on the optical wavelength of each component of the optical spectrum of the pulse. In this manner, an optical wavelength of the component optical energy may be related to a wavelength-dependent relative time delay and, as the relative time delay is a function of optical wavelength, the optical signal may have time-delay dispersion. The dispersion characteristic may be expressed, for example, in ps/nm/meter, where wavelength is expressed in nanometers, and the length of the fiber is in meters.

At the output of the dispersive pulse stretcher 4, the optical energy of the pulse has a temporal property such that the optical power is a time varying quantity. The dispersive pulse stretcher 4 has the effect of mapping the spectral power distribution to a temporal power distribution through-the dispersive transformation. That is, envelope of the optical energy waveform is the resultant of the spatial modulation of the input optical pulse 1 in the wavelength domain by the FT pulse shaper 2, and the subsequent dispersion of the optical signal in the time domain by the dispersive optical pulse stretcher 4. The optical energy temporal waveform at the output 5 of the dispersive pulse stretcher 4 represents the temporal characteristics of the desired electrical pulse 8.

The optical energy output from the photonic waveform generator is converted to an electrical signal in, for example, a photodetector 6, where the electrical current signal output 8 is proportional to the instantaneous optical power input thereto. A photodetector 6 may have the effect of converting the optical signal within the detection bandwidth of the photodetector 6 into a current proportional to the instantaneous power of the optical signal. In this manner, an electrical signal 8 may be generated possessing substantially the same temporal characteristics as the time-dispersed optical energy impinging on the photodetector 6. This electrical signal 8 may be further transformed into a voltage in, for example, a transimpedance amplifier, and amplified and further processed by amplifiers, filters and other electrical and radio frequency circuit components. The amplification and further processing of an electrical signal is well known in the art, and all of the known techniques, or techniques which may be subsequently be developed, for radio frequency processing and transmission may be used in conjunction with the signal 8, which has been generated by the photonic generator and opto-electronic converter means.

While an LCM has been described as the means for modifying the optical power spectrum by varying the transmission characteristics of the LCM, it should be appreciated that other devices may be used to vary the spatial power transmission in an FT pulse shaper. In circumstances where the properties of the waveform are not intended to be changed with time (that is, the time scale involved is a multiple of the pulse repetition interval, or the waveform characteristics are fixed during the design process), the LCM may be replaced with an optical mask whose spatial variation of transmission characteristics corresponds to, for example, one or more data configurations of the LCM which represent the desired spatial transmission characteristics in phase, amplitude or both.

The design of electrical waveforms may encompass a variety of characteristics such as bandwidth, center frequency, spectral shape, and spectral phase, depending on the intended use. Specific temporal-electrical waveforms may achieve a particular transmitted radio-frequency spectral distribution, and spectral phase may be used in order to uniquely specify the radio frequency waveform, although this is not required for every type of use.

Optical pulse 1 has a finite time duration at the input to the waveform generator 7. The effect of the finite pulse duration on the shape of the electrical waveform is to weight the overall optical spectrum and thus the electrical waveform, and this effect may be accommodated in the waveform design. That is, it is known in the art that an ideal impulse has a theoretically infinite bandwidth and a flat spectral distribution. Actual impulses may be very short in time duration, but as the time duration is finite, the corresponding spectrum also has a finite extent. As such, the spectrum of the optical energy may have a slow variation with wavelength.

It should be appreciated that the power in the optical signal is greater or equal to zero at all time during the duration of the pulse. Yet, many signals to be generated have sinusoidal aspects which are oscillatory in nature, and would ordinarily have both positive and negative voltage or current components at various times during the duration thereof. One way of accommodating this is to add a sufficient DC pedestal to the optical intensity being generated such that the optical intensity at the input to the detector 6 accommodates the oscillatory nature of optical waveform corresponding to the time-domain signal while maintaining the optical energy greater than or equal to zero. This has the effect of imposing a DC pedestal on the resultant electrical time-domain signal produced at the output of the detector 6 by the detection of the modulated time-dispersed optical signal pulse.

The effect of the optical DC offset is to produce an electrical signal component at zero frequency, and as this DC offset is of finite time duration, corresponding to substantially the duration of the pulse, spectral leakage of the DC component occurs. This may be mitigated by amplitude weighting the optical spectrum; that is, by apodizing. A variety of apodizing functions are known in the art of spectral processing and may include, Gaussian, Hanning, Hamming, and Taylor weighting, triangular weighting, and the like. An electrical signal may therefore be generated and positioned at an arbitrary center frequency by amplitude modulating the optical spectrum in a sinusoidal manner with optical frequency so that, when transformed into the time domain through the dispersive optical stretcher, the resultant electrical signal has a sinusoidal oscillation at the desired center frequency. This is most effectively done by apodizing the optical waveform by amplitude modulating the optical spectrum in a FT pulse shaper.

When the apodized optical spectrum is transformed by the dispersive line and converted into an electrical signal, the spectral weighting mitigates the spreading of energy of the DC pulse such that the desired spectrum can be observed with less influence of the DC spectral sidelobes. At this juncture, the low frequencies associated with the DC pulse sidelobes can be suppressed by electrical filtering, typically associated with amplifiers, filters and antennas. In addition to managing the spectral broadening due to the DC pedestal, apodization may be used to compensate for optical spectral variations due to, for example, the characteristics of the optical source and the finite time duration of the pulses.

The spectral shape (that is, the envelope of the signal energy as a function of frequency or wavelength) of a generated signal waveform may be determined by defining the spectrum about DC, to include the spectral shape and bandwidth. The spectral shape may be a known function, a regulatory specification, a waveform optimized to detect a target or to overcome the distortions of the transmission and reception processes, or intended for communications purposes (such as intra-pulse phase-shift keying). After defining the spectral shape, the spectral phase may also be specified. A combination of the spectral amplitude and spectral phase may uniquely define the time-domain waveform corresponding thereto. Alternatively, a number of different time-domain waveforms may be synthesized having the same radio frequency spectrum, but differing spectral phase.

The desired electrical waveform spectral shape, and the spectral phase if also desired, may be inverse Fourier transformed in order to define a time-domain waveform meeting the spectral requirements. A DC level is added to the resultant optical signal so that the temporal optical intensity is greater than or equal to zero during the pulse duration. The electrical signal frequency spectrum may be shifted to a desired center frequency by amplitude modulating the time-domain waveform obtained by the zero frequency design process with a sinusoidal signal having the desired center frequency. The value of the DC level is dependent on the specific time-domain waveform being synthesized.

The temporal characteristics electronic signal may be engineered to satisfy a variety of applications, as the temporal waveform produced is limited only by the resolution of the FT pulse shaper and the characteristics of the optical dispersion network which is used to subsequently process the optical energy. Arbitrarily specified electrical waveforms produced by a photonic generator may be used in a variety of electrical and electromagnetic systems, as the waveform may be designed to meet a variety of regulatory or system performance requirements. Combining a photonic waveform generator, which may include a Fourier transform (FT) optical pulse shaper, such as the reflective type shown in FIG. 1, a four-focal length FT pulse shaper (transmissive-type), or similar configuration, having a spatial mask such as an amplitude, phase or amplitude and phase spectral mask, and may include a dispersive pulse stretcher and a photodetector, with electronics and electromagnetic structures such as amplifiers, filters, detectors and the like, may permit the optimization to be performed for signals having wide percentage bandwidths and being in the microwave, millimeter wave and higher frequency regimes. In these systems, the dispersive pulse stretching may be by a fiber, by bulk optics, or by, for example altering the geometry of the pulse shaper such that the spacing between the spectrally-dispersive elements and the lenses is not equal to the focal length of the lenses. A combination of such techniques may be used. Alternatively, the photonic waveform generator may be of the direct space-to-time type. A direct space-to-time (DST) pulse shaper includes a spectrally-dispersive element placed in the front focal plane of a lens and a thin spatial slit placed at the back focal plane of the lens. This apparatus is essentially a simple spectrometer. The user-defined spatial masking function (described here for simplicity as an amplitude masking function) may be applied to the input optical beam prior to a diffraction grating. For a broad input beam in the absence of a mask, the apparatus functions as a spectrometer, i.e. the output slit selects a narrow band of optical frequencies determined by the transverse location of the slit. The grating introduces a time-delay across the input beam as, for a particular slit position, the optical signal at each optical frequency traverses a different optical path to arrive at the output slit. For a short input pulse, the duration of the output optical waveform is determined by spot size of the input beam on the grating. When the input beam is spatially patterned prior to the grating, the spatial pattern effectively turns off the optical intensity in the longer output pulse at time corresponding to the spatial pattern. Thus, there is a direct mapping between the parallel spatial optical intensity profile at the input and the serial temporal optical intensity profile at the output. This geometry may be well suited to generation of high-rate optical pulse sequences.

In either pulse shaping method (FT or DST), the achievable temporal resolution in the output optical waveform is determined by the input optical pulsewidth, and the waveform duration may determined by the spectral resolution of the pulse shaper. (In this discussion, the bandwidth of the optical-to electrical converter is presumed not to be limiting). In either geometry, the use of a diffraction grating results in a pulse shaper that exhibits an output waveform duration (pulse-shaping time-aperture) on the order of $\Delta T=25$ ps. As such, the lowest frequency structure that may be achieved in the output optical intensity waveforms from these systems is approximately $f_{min} \approx 2/\Delta T \approx 80$ GHz. Diffraction grating-based shapers may be built in a high-resolution configuration and achieve time apertures on the order of $\Delta T \approx 100$ ps, resulting in frequency content extending down to about 20 GHz in the output optical intensity waveforms.

It is also possible to produce nanosecond waveform durations directly from either pulse shaping geometry by utilizing alternative spectral dispersers. In particular, virtually-imaged phased arrays (VIPAs) exhibit spectral dispersion that may exceed that of diffraction gratings; the resulting increase in spectral resolution may enable nanosecond waveform durations to be produced directly from the shaper.

Optical-to electrical converters or photodetectors, may be photodiodes, photomultipliers, photoconductive antennas, or any other devices performing the same or similar function and having sufficient electrical bandwidth to accommodate the signal.

An electromagnetic waveform may be produced by a photonic waveform generator for broadband electromagnetic systems having specific emission guidelines for spectral content, power spectral density and the like. In some situations a spectral mask may be required by governmental regulation, so that the spectral content over a frequency range meets specified criteria, which may also include a peak-to-average signal ratio. As described previously, a photonic waveform generator shapes the optical power intensity. In the electrical domain, a desired power spectrum shape may not uniquely define the required time-domain waveform. When the design requirements of a system are such that a specific spectral mask is needed, signal design may effectively use the optical power by specifying the electrical spectral phase. For example, the use of chirped waveforms in place of broadband impulses may result in higher detected signal amplitudes, while having an identical or essentially identical electrical spectrum.

In another aspect, broadband sensing systems, such as impulsive radar, may have waveforms optimized or adaptively optimizable to improve target detection. In such optimizations, an objective may be to maximize the returned power from a specific type of target for a given peak or average power transmitted, to minimize the transmitted time sidelobes, to minimize duration of the received signal, to minimize the time extent or amplitude of returned signal sidelobes for the desired signal, or the like. These examples are merely representative of the types of system and waveform design considerations which may be addressed using a photonic waveform generator, and a person of ordinary skill in the art will appreciate that many other optimizations, or combinations of optimizations are possible, depending of the specific application.

Signal waveforms may also be optimized to distinguish between different types of radar targets by, for example, matching the transmitted waveform to the desired target, or by considering both the desired and the undesired target, which may include clutter, and designing a waveform such that the desired to undesired target signal is maximized.

Figure 3:
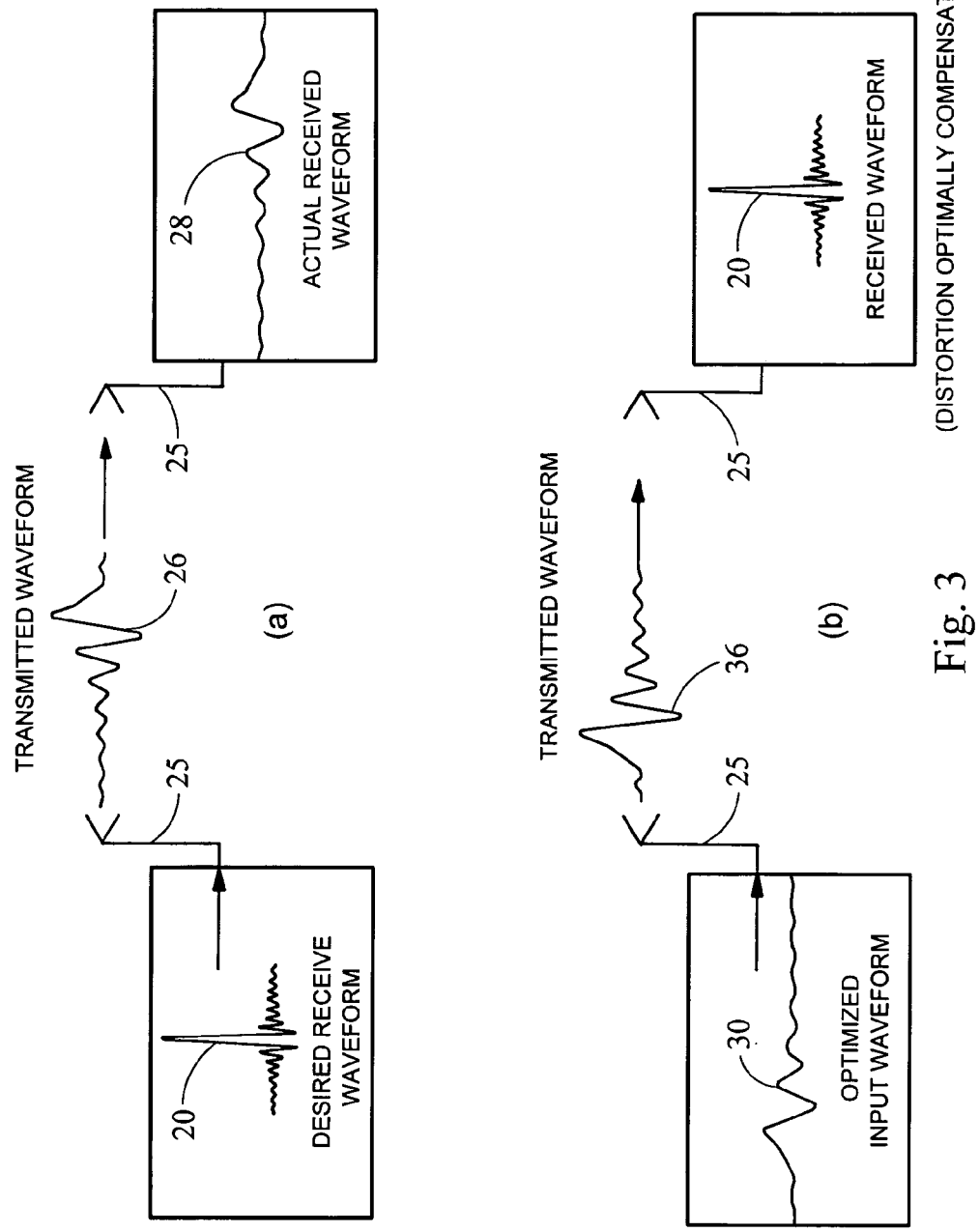
FIG. 3a illustrates an electromagnetic system showing the distortion of an idealized generated waveform during the process of transmission and reception.
FIG. 3b illustrates the electromagnetic system of FIG. 3a, where the transmitted waveform has been altered to account for the distortion of the transmitted waveform so as to achieve a desired waveform at the receiver.

Electromagnetic systems and components may distort transmitted and received broadband signals. Distortions may arise from system components such as the transmitting and receiving antennas, amplifiers and filters, or by the medium through which the signal propagates. Distortions may occur with respect to frequency and/or phase and the distortions may be time varying. FIG. 3a shows a situation where the desired received waveform 20 is generated at a transmitting end, and emitted through a transmitting antenna 25. The transmitting antenna 25 is representative of a system component which may distort the waveform, but as stated previously, many sources of distortion are known, and the use of an antenna as a passive element to represent the distortion is not meant to limit the distortion to that caused by passive components, to suggest that the distortion may not be time varying, or to indicate that the distortion is caused in only the transmitter and receiver equipment.

Thus the transmitted waveform, which in this case was generated as a waveform 20 that would be the ideal waveform to be received, providing that the waveform had not been distorted, has suffered distortion between the generation of the waveform and the transmission thereof. The distorted waveform 26 is illustrated as traveling from the transmitting antenna 25 to the receiving antenna 25. For convenience, the characteristics of the transmitting antenna and the receiving antenna in this example may be the same; however, the use of the same reference numeral for both of the antennas should not be understood to require that each of the antennas have the same characteristics. The principal function of the antenna is to transmit or receive electromagnetic radiation. Distortion is an undesired but common artifact of the antenna and other components.

Further distortion may occur, for example, in the receiving antenna 25, such that the actual received waveform 28 is different from that of the originally generated waveform. The difference may be substantial or slight, based on the severity of the distortion. The phase and amplitude response of antenna systems may not be optimized for broadband signals. However, the effects of distortion may be mitigated as illustrated in FIG. 3b, where the generated waveform 30 at the transmitter has been optimized (pre-distorted) such that after passing through the components of the transmitting and receiving system such as the antennas 25, and being propagated between the transmitter and the receiver, the received waveform 20 has the characteristics of the desired received waveform; that is, the transmitted waveform 20 shown on the generating side in FIG. 3a. Examples of optimization of a waveform may include maximizing the received peak signal amplitude and minimizing the received signal duration for a given transmitted energy.

Figure 4:
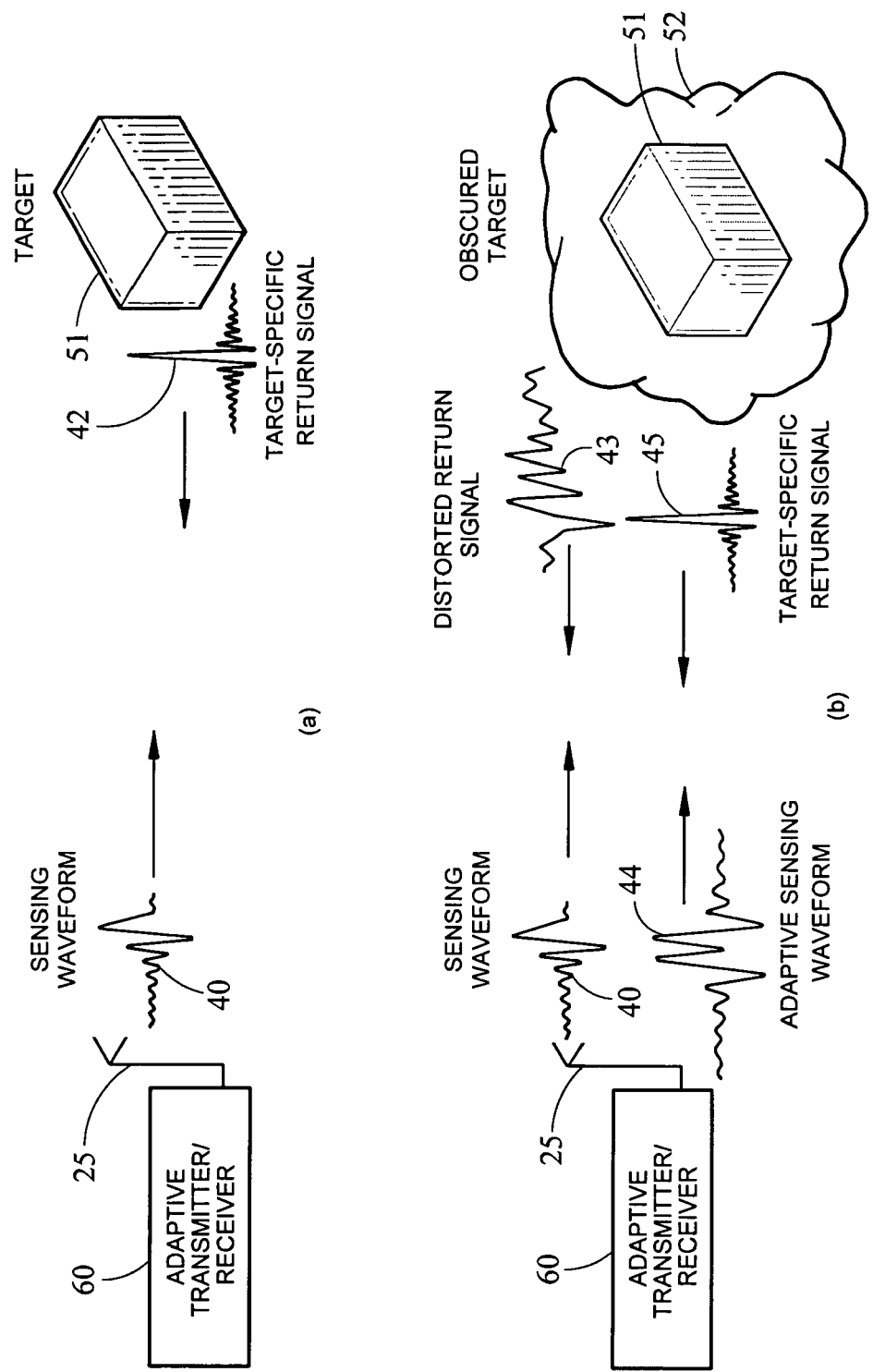
FIG. 4a illustrates an electromagnetic system having a transmit/receive capability where the sensing waveform is optimized with respect to an unobscured target.
FIG. 4b illustrates the electromagnetic system of FIG. 4a where the sensing waveform is distorted by the environment, and where the waveform is adapted to compensate for the environmental distortion.

In another aspect, electromagnetic sensing systems such as impulsive radar may use the adaptive ability of a photonic waveform generator to enhance performance. Such systems may be optimized to detect signals propagating through foliage or man-made concealments, for ground penetration, or detection of signals in the presence of "clutter", and the like. As shown in FIG. 4a, a waveform 40 may be designed to optimize the returned signal 42 from a specific target type 51. In this example, the waveform may have the effect of maximizing the returned signal for a specific radar target type. The transmitted waveform 40 is shown as having been radiated by the antenna, and the signal 40 has been adapted to take account of any distortion imposed in the transmission process. Similarly, the signal 42 reflected from the target 51 is shown in the form in which it will have been received by the radar through antenna 25, including all distortions occurring prior to detection.

However, if the same target 51, as shown in FIG. 4a, is concealed in foliage 52 or other clutter, the signal propagating to and from the target may be distorted due to the obscuration. Here, a sensing signal 40 is transmitted and reflected from both the target 51 and the foliage 52, and is distorted with respect to the target-specific-signal 42 which would have been received in the absence of the foliage 52. In this respect, the foliage 52 may be considered as representative of "clutter".

An adaptive signal generator may be utilized to alter the transmitted signal as a sensing signal as shown in FIG. 4b to transmit a modified waveform 44 so that the signal 45 returned from the target 51, including the distortions due to the foliage 51, when received by the transmitter/receiver has desirable properties, such as maximum peak amplitude, maximum signal-to-noise or minimum signal duration.

Figure 5:
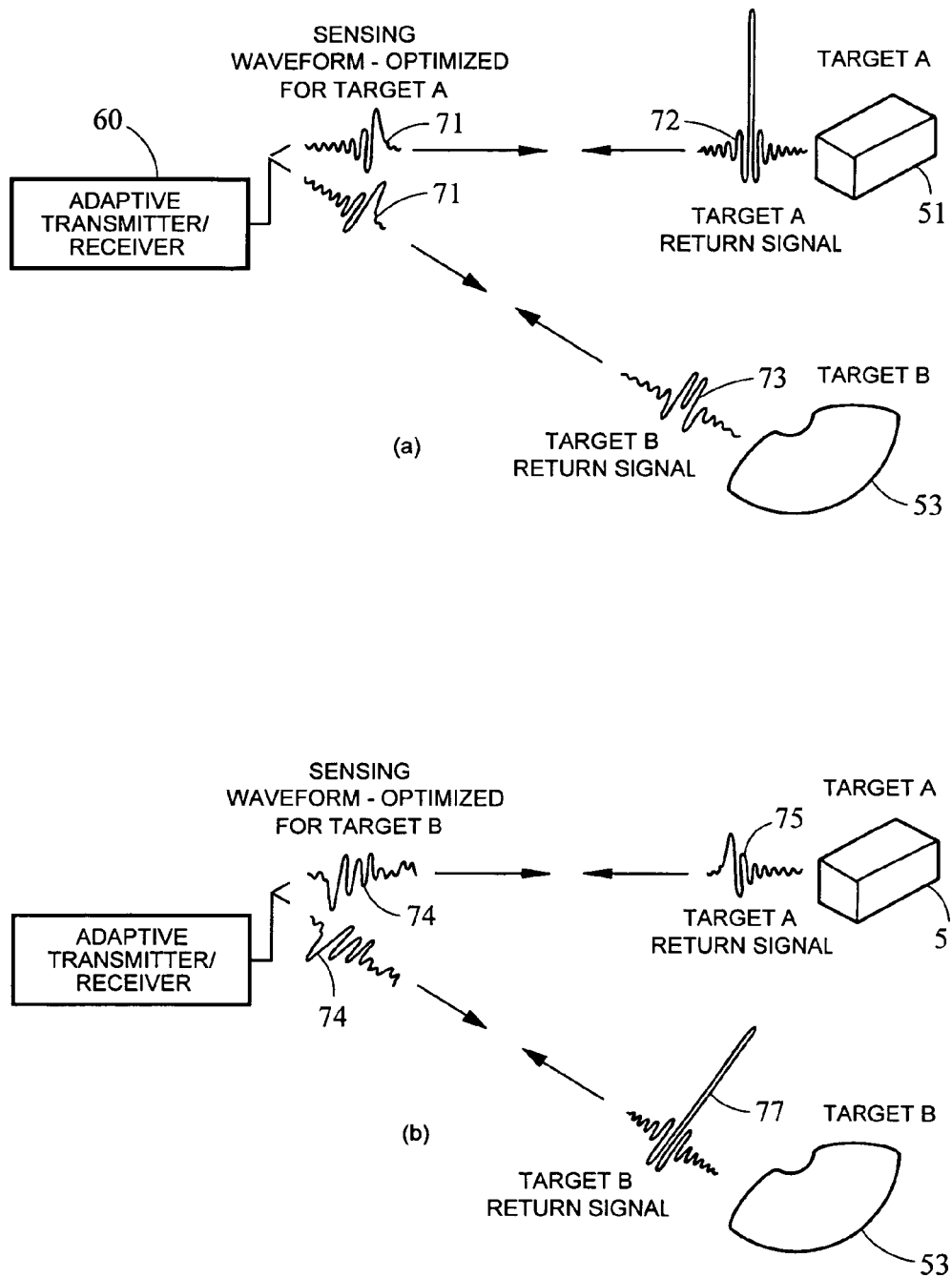
FIG. 5a illustrates an electromagnetic system as shown in FIG. 4a, where two targets having different return signals are present and the transmitted waveform is optimized so that the received waveform from target A is enhanced.
FIG. 5b illustrates the electromagnetic system as shown in FIG. 5a where two targets having different return signal are present and the transmitted waveform is optimized so that the received waveform from target B is enhanced.

In a further aspect, the generated waveform may be designed or adapted to improve target discrimination: that is, to distinguish one target from another by characteristics such as range, time duration of the returned signal and the like. FIG. 5a illustrates a situation where a radar (transmitter/receiver) 60 emits a signal 71 configured so as to yield an optimum response signal 72 from a target A 51. The signal is also reflected by target B 53 and, generally, the signal waveform 73 will differ from signal waveform 72 reflected from target A 51. Target B 53 may have a radar cross section with a different optimum signal requirement, and the desired characteristic of a radar signal return such as large amplitude, or short time duration return may not be achieved. Alternatively, as shown in FIG. 5b, it may be desired to optimize the return from target B 53, and the generated waveform is changed to achieve this result. The transmitted signal 74 results in an optimized signal return 77 from target B 53, and may not result in an optimized signal return 75 from target A 51. Design of the generated waveforms may be based on actual observations of targets, by analytic calculations, or by scale-model measurements.

In yet another aspect, the generated waveform may be produced by impinging a series of high-pulse-rate short-duration optical signals on a photodetector and filtering the electrical output of the photodetector so as to generate a quasi-sinusoidal waveform. The spectral and temporal properties of the resultant electrical waveform may be controlled by varying the amplitude of the optical pulses over a time interval, the inter-pulse period over a time interval, or both. Either band-pass or low-pass filtering may be used. Electrical waveforms generated in this manner may be used in any of the systems previously described. It will be apparent to a person skilled in the art that the electromagnetic systems described above may be combined to achieve more than one of the optimizations described. Moreover, it will similarly be apparent to a person skilled in the art that the examples of optimizations presented as examples are in no way a complete listing of the system optimizations which may be related to waveform design and which may be possible when a photonic generator capable of generating substantially arbitrary electrical waveforms, and the waveforms may be radiated as electromagnetic signals.

While the examples of Fourier transform (FT) pulse shapers and direct space to time (DST) pulse shapers described herein have used bulk optics, such functionality may also be realized in integrated optics implementations, for example, or hybrids of bulk and integrated optics using planar lightwave circuits and modified arrayed waveguide grating (AWG) structures. An integrated optical pulse shaper can be used in a photonic waveform generator prior to the optoelectric signal format conversion, either with or without time dispersion, as appropriate.

Several examples of waveforms which have been generated by the photonic waveform generator shown in FIG. 1 are described to give an appreciation for the variety of signals that may be generated. It will be appreciated that the specific waveforms and the techniques for establishing a desired waveform are given solely to aid in understanding the operation of the photonic waveform generator, and that the characteristics of waveforms which may be generated by the photonic waveform generator are in no way limited by the examples.

Example 1

Figure 6:
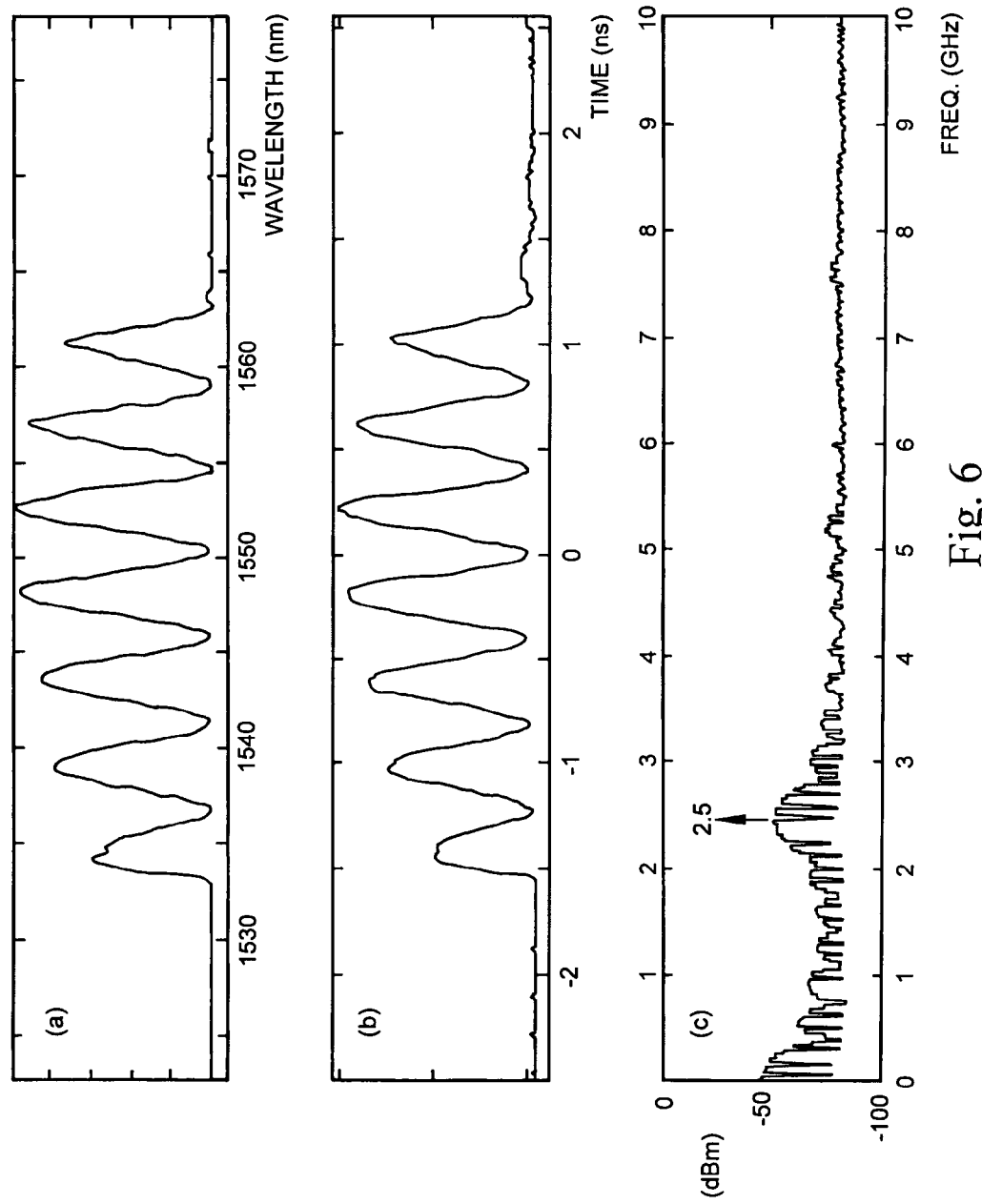
FIG. 6 shows (a) the optical spectrum, (b) the corresponding electrical waveform produced by the waveform generator, and (c) the spectrum of the electrical waveform, illustrating the placement of the pulse at a center frequency of 2.5 GHz.

In this example, the generation of a simple pulse having a defined center frequency is described. It is desired to produce a pulse having a waveform having a center frequency of about 2.5 GHz and having a temporal pulse duration of about 2.5 ns. FIG. 6a shows the optical spectrum at the output of the reflective FT pulse shaper 2 where the optical spectrum has been modulated in wavelength with a modulation period of about 4.2 nm. After passing through a dispersive stretcher 4 having a total chromatic dispersion of about 96 ps/nm, the temporal characteristics of the optical waveform and the resulting time-domain electrical waveform are shown in FIG. 6b. This results in the electrical power spectrum shown in FIG. 6c, which exhibits the desired characteristics, but also shows the effect of adding a DC pedestal to the optical spectrum and not applying apodizing. There is also a slight wavelength dependence of optical power evident in FIG. 3a which may be due, in this instance, to the finite pulse duration of the optical source used.

Example 2

Figure 7:
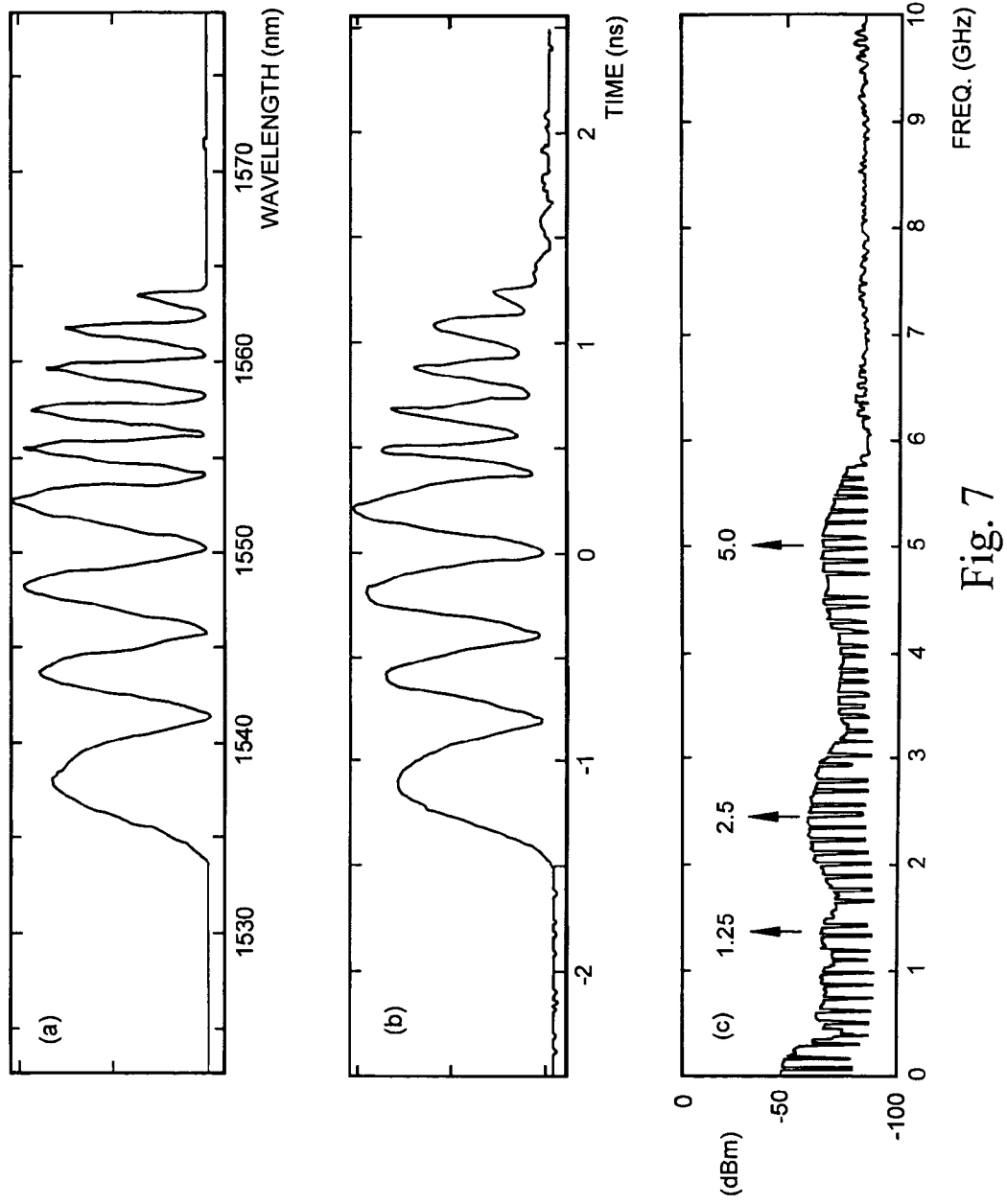
FIG. 7 shows (a) the optical spectrum, (b) the corresponding electrical waveform produced by the photonic waveform generator, and (c) the spectrum of the electrical waveform, illustrating the generation of a discretely chirped waveform.

In this example, a waveform whose frequency spectrum is not known to be generated by presently available electronic techniques is illustrated, and the example also illustrates the generation of a waveform having an arbitrary time history; in this case a chirp waveform comprised of 1.25/2.5/5 GHz cycles. FIG. 7 shows the filtered optical spectrum, which has been patterned with a sinusoidal shape varying discretely in period from about 8.4 nm (0.5 cycle), to about 4.2 nm (2.5 cycles), to 2.1 nm (4 cycles), corresponding to the desired electrical frequencies. After stretching in the dispersive stretcher 4, and conversion into an electrical signal by the photodetector 6, the electrical waveform 8 is characteristic of a frequency modulated signal having abrupt transitions between 0.5 cycles at about 1.25 GHZ, 2.5 cycles at about 2.5 GHz and 4 cycles at 5 GHz. The electrical spectrum of this signal shows three main peaks, centered at 1.25, 2.5 and 5.0 GHz.

Example 3

Figure 8:
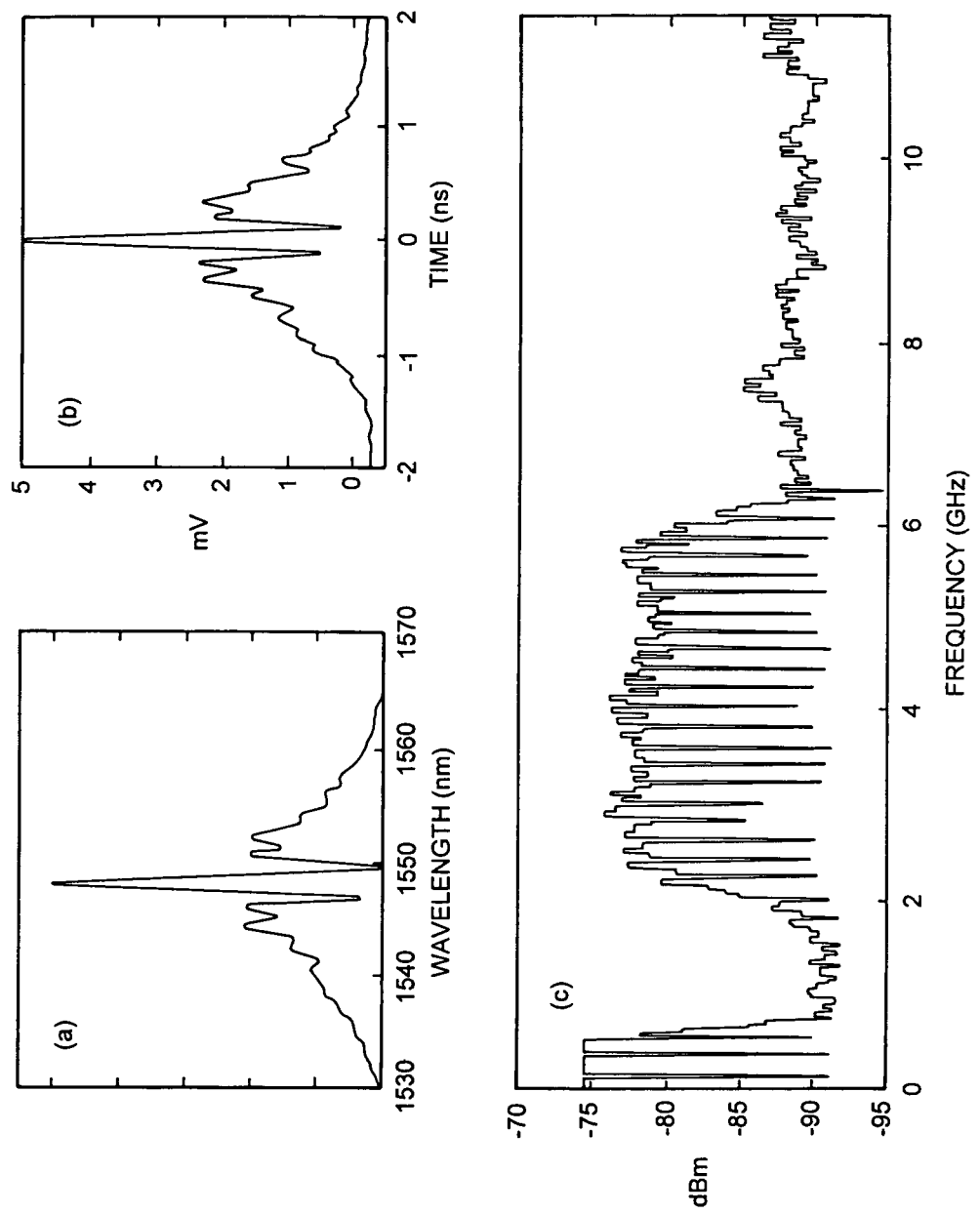
FIG. 8 shows (a) the optical spectrum, (b) the corresponding electrical waveform produced by the photonic waveform generator, and (c) the spectrum of the electrical waveform, illustrating the generation of a electrical wideband waveform having a super-Gaussian RF spectral characteristic.

In another example, consider the tailoring of an ultra-broadband signal which may result in spectral characteristics compatible with regulatory limitations on transmitted RF spectral energy. In this instance, the design objective was to produce an electrical signal having a flat spectral amplitude over a defined frequency range. An apodization function was selected to achieve a super-Gaussian target RF spectrum. This target RF spectrum is inverse Fourier transformed to generate the optical filter function to be applied by the FT pulse shaper. The resultant optical signal, as a function of wavelength, resulting from this process is shown in FIG. 8b. FIG. 8b shows the corresponding temporal waveform; it should be appreciated from the foregoing discussion, that the optical power spectrum has the same shape as the resultant electrical waveform, being related through the dispersion function of the dispersive stretcher. The electrical waveform of FIG. 8b has a duration of about 450 ps (between the first two nulls) and rides on a small DC pedestal, as has been previously described. In FIG. 8c, it may be seen that the power spectrum is very broad and shows a substantially super-Gaussian shape with a bandwidth of about 3.5 GHz. The majority of the spectral fluctuation outside the main spectral energy region may be attributed to the DC pedestal in the time domain, and may be mitigated by applying an appropriate apodization to the spatially dispersed optical spectrum in the FT pulse shaper.

Example 4

Figure 9:
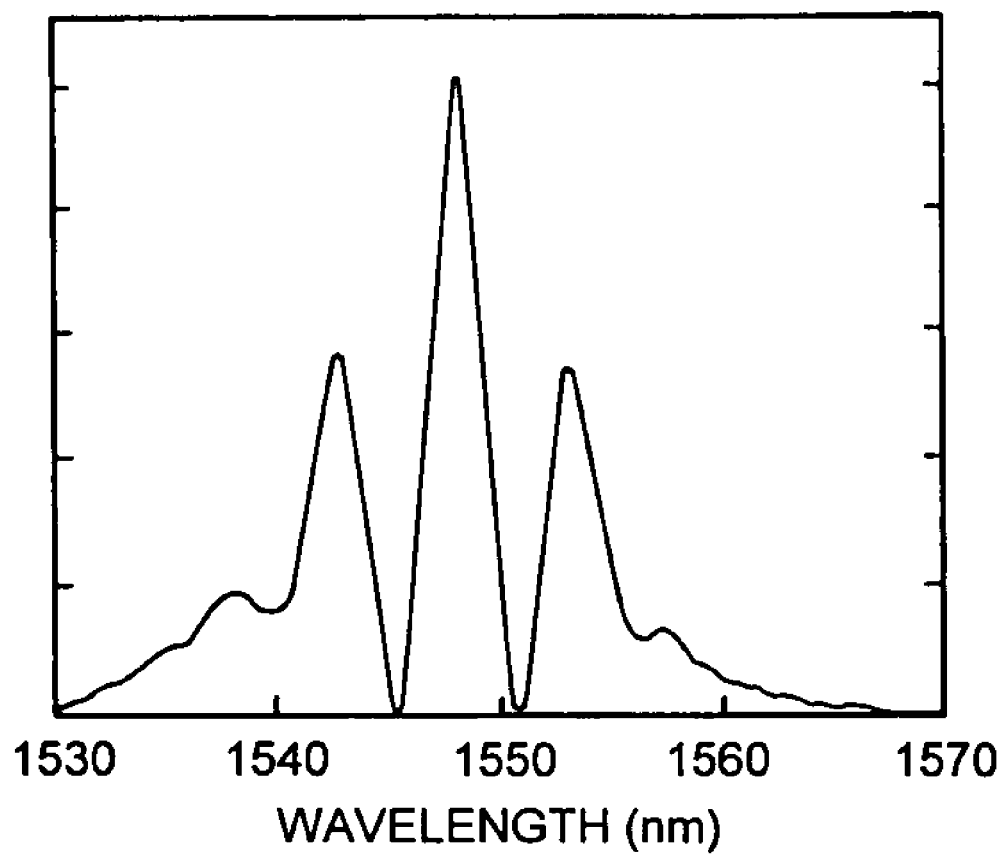
FIG. 9 shows the optical spectrum of an apodized optical spectrum with a periodic modulation of the power with wavelength.
Figure 10:
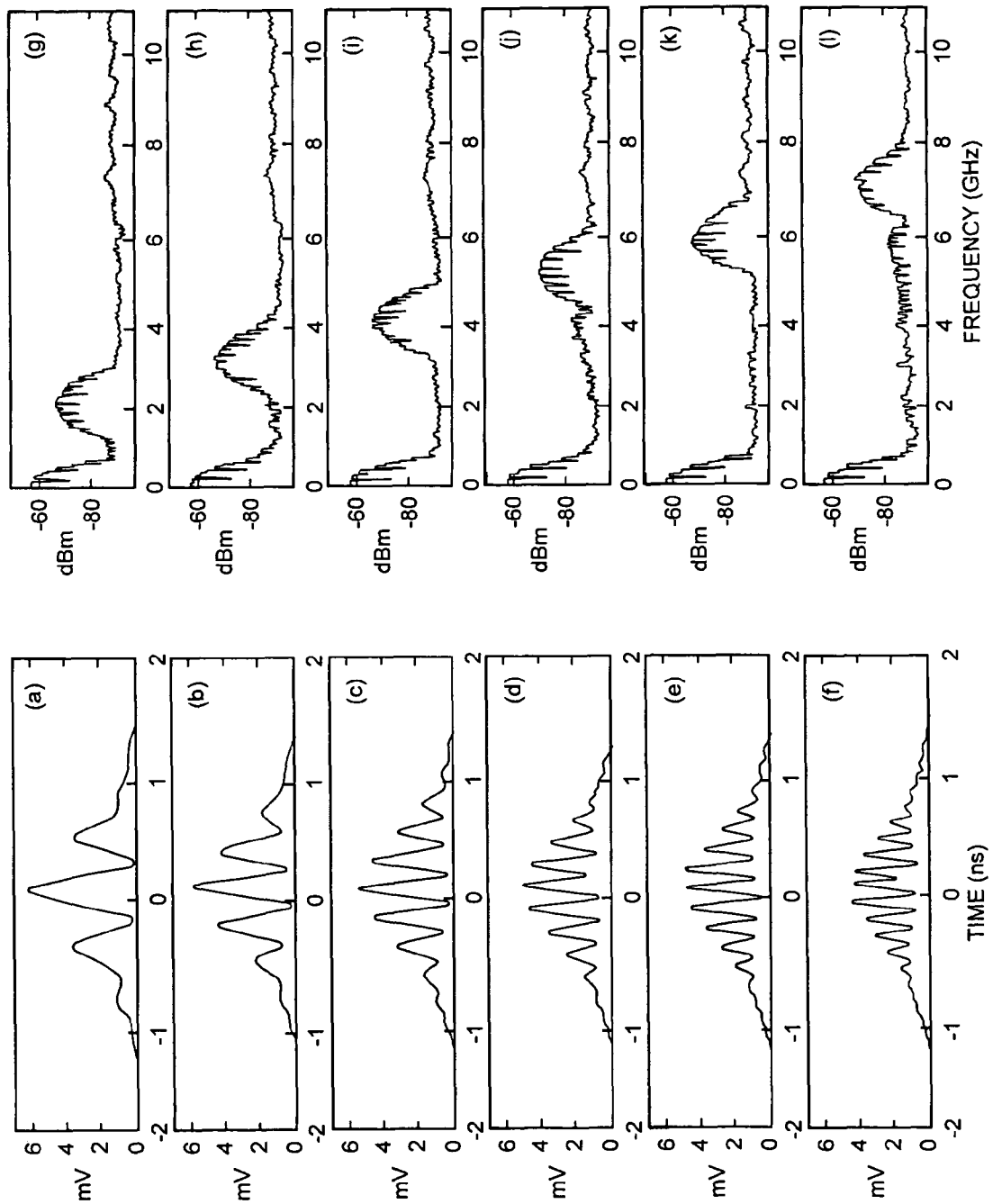
FIG. 10 shows the electrical waveform (a-f) and the corresponding RF spectral characteristics (g-l) of an apodized waveform, (a) and (g), corresponding to the optical signal in FIG. 6, and the RF center frequency being increased by approximately 1 GHz in each of the successive examples.

This example illustrates the ability to place the center frequency of the spectrum of a generated waveform at a desired frequency. The target electrical spectrum is 1 GHz full-width at 1/e points super Gaussian. In the time domain, after apodization, the base waveform is approximately Gaussian with a FWHM (full-width-at-half-maximum) duration of 1 ns. When this base time-domain signal is amplitude modulated with a sinusoidal waveform of frequency $f_c$, the spectrum of the resulting waveform exhibits a spectral bandwidth determined by the apodization function and a center frequency determined by the modulating sinusoid. To obtain a center frequency of 2 GHz, a sinusoidal modulation with an approximately 5.2 nm period is applied to the optical spectrum (FIG. 9). After O/E conversion in a detector 6, the time-domain electrical waveform is a Gaussian-shaped burst modulated by an approximately 2 GHz sinusoid as shown FIG. 10a. The electrical spectrum of this waveform FIG. 10g shows an approximately 1 GHz width spectral peak centered at 2 GHz. Apodization results in the DC and desired portions of the spectrum being well separated. In each subsequent pair of traces in FIG. 10 (e.g., (b) and (h)), the modulation frequency is increased by 1 GHz. The electrical spectrum peak, while maintaining a bandwidth of approximately 1 GHz, accordingly steps to higher and higher frequencies.

It is therefore intended that the foregoing detailed description be regarded as illustrative rather than limiting, and that it be understood that it is the following claims, including all equivalents, that are intended to define the spirit and scope of this invention.

What is claimed is:

1. A photonic waveform generator, comprising:
   a wavelength-dependent optical spectral amplitude shaper, the optical spectral amplitude shaper including a reflective-type spatial modulator;
   a wavelength-dependent time-delay network; and
   an optical-to-electrical converter.

2. The photonic waveform generator of claim 1, wherein the optical-to-electrical converter is a photodetector.

3. The photonic waveform generator of claim 2, wherein the photodetector is a photodiode.

4. The photonic waveform generator of claim 1, wherein the wavelength dependent time delay network comprises an optical fiber.

5. The photonic waveform generator of claim 1, wherein the wavelength-dependent optical spectral amplitude shaper further comprises:
   a spatial modulator;
   an optical grating; and
   a reflective surface.

6. The photonic waveform generator of claim 5, wherein the spatial modulator is a liquid crystal module.

7. The photonic waveform generator of claim 6, wherein the liquid crystal module is disposed between the optical grating and the reflective surface.

8. The photonic waveform generator of claim 5, wherein the reflective surface is a mirror.

9. The photonic waveform generator of claim 5, where the spatial modulator is a transmissive film having at least one of a spatial pattern of transmission loss or transmission phase shift.

10. The photonic waveform generator of claim 1, wherein an input and an output of the wavelength-dependent optical spectral shaper are co-linear.

11. The photonic waveform generator of claim 1, wherein the wavelength dependent time-delay network is at least one of a grating, prism, or virtually imaged phased array (VIPA).

12. A method of producing an arbitrarily shaped electrical pulse, comprising:
    providing a pulsed optical signal;
    modifying the pulsed optical signal in a optical spectral amplitude shaper including having a reflective configuration;
    time dispersing the pulsed optical signal; and
    applying the optical signal to an optical-to-electrical converter to produce an electrical signal.

* * * * *